(12) United States Patent
Cho et al.

(10) Patent No.: US 12,096,679 B2
(45) Date of Patent: Sep. 17, 2024

(54) DISPLAY DEVICE

(71) Applicant: Samsung Display Co., Ltd., Yongin-Si (KR)

(72) Inventors: Sunhaeng Cho, Hwaseong-si (KR); Changmin Park, Gwangmyeong-si (KR); Hyoyul Yoon, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1077 days.

(21) Appl. No.: 16/929,644

(22) Filed: Jul. 15, 2020

(65) Prior Publication Data

US 2021/0104693 A1 Apr. 8, 2021

(30) Foreign Application Priority Data

Oct. 7, 2019 (KR) .......................... 10-2019-0123817

(51) Int. Cl.
| | |
|---|---|
| *H01L 51/00* | (2006.01) |
| *B32B 5/18* | (2006.01) |
| *B32B 27/06* | (2006.01) |
| *B32B 27/28* | (2006.01) |
| *B32B 27/30* | (2006.01) |
| *B32B 27/36* | (2006.01) |
| *B32B 27/40* | (2006.01) |
| *G06F 3/044* | (2006.01) |
| *H01L 27/32* | (2006.01) |
| *H01L 51/52* | (2006.01) |
| *H10K 50/84* | (2023.01) |

(Continued)

(52) U.S. Cl.
CPC .............. *H10K 77/111* (2023.02); *B32B 5/18* (2013.01); *B32B 27/06* (2013.01); *B32B 27/281* (2013.01); *B32B 27/308* (2013.01); *B32B 27/36* (2013.01); *B32B 27/40* (2013.01); *G06F 3/044* (2013.01); *H10K 50/841* (2023.02); *H10K 59/12* (2023.02); *H10K 59/40* (2023.02); *B32B 2307/304* (2013.01); *B32B 2457/206* (2013.01); *B32B 2457/208* (2013.01); *G06F 2203/04102* (2013.01); *H10K 2102/311* (2023.02)

(58) Field of Classification Search
CPC ..................................................... G06F 1/1652
See application file for complete search history.

(56) References Cited

U.S. PATENT DOCUMENTS

| | | |
|---|---|---|
| 10,067,536 B1 | 9/2018 | Watamura |
| 10,230,062 B2 | 3/2019 | Kim et al. |

(Continued)

FOREIGN PATENT DOCUMENTS

| | | |
|---|---|---|
| KR | 1020170093610 A | 8/2017 |
| KR | 1020180006530 A | 1/2018 |

(Continued)

*Primary Examiner* — Ian A Rummel
(74) *Attorney, Agent, or Firm* — CANTOR COLBURN LLP

(57) ABSTRACT

A display device includes a display module including a first non-folding area, a folding area, and a second non-folding area, which are arranged in a first direction, a cushion layer disposed under the display module, and a supporter disposed under the cushion layer. The folding area is disposed between the first and second non-folding areas. A groove that overlaps the folding area and extends in a second direction crossing the first direction is defined in the cushion layer.

17 Claims, 16 Drawing Sheets

(51) Int. Cl.
*H10K 59/12* (2023.01)
*H10K 59/40* (2023.01)
*H10K 77/10* (2023.01)
*H10K 102/00* (2023.01)

(56) References Cited

U.S. PATENT DOCUMENTS

| | | | |
|---|---|---|---|
| 10,368,452 | B2 | 7/2019 | Yun et al. |
| 11,084,250 | B2 | 8/2021 | Jung et al. |
| 2015/0372028 | A1* | 12/2015 | Lee .................. G02F 1/13338 |
| | | | 438/50 |
| 2016/0357318 | A1* | 12/2016 | Chan .................. H10K 50/841 |
| 2018/0175310 | A1 | 6/2018 | Lee et al. |
| 2018/0352664 | A1 | 12/2018 | Park et al. |
| 2021/0174709 | A1* | 6/2021 | Xiang .................. H05K 1/028 |

FOREIGN PATENT DOCUMENTS

| | | |
|---|---|---|
| KR | 1020180042515 A | 4/2018 |
| KR | 1020180079016 A | 7/2018 |
| KR | 1020180133287 A | 12/2018 |
| KR | 1020190052954 A | 5/2019 |

* cited by examiner

DISPLAY DEVICE

This application claims priority to Korean Patent Application No. 10-2019-0123817, filed on Oct. 7, 2019, and all the benefits accruing therefrom under 35 U.S.C. § 119, the content of which in its entirety is herein incorporated by reference.

BACKGROUND

1. Field

Exemplary embodiments of the invention relate to a display device. More particularly, exemplary embodiments of the invention relate to a display device capable of preventing a folding area from being deformed.

2. Description of the Related Art

Electronic devices that provide an image to a user, such as a smart phone, a digital camera, a notebook computer, a navigation unit, and a smart television, include a display device to display the image. The display device generates the image and provides the image to the user through a display screen thereof.

In recent years, with a technological development for the display device, various types of display devices have been developed. Various flexible display devices, which are capable of being transformed into a curved shape, foldable, or rollable, are being developed, for example. The flexible display devices, which are capable of being transformed into various shapes, are easy to carry and improve a user's convenience.

SUMMARY

Among the flexible display devices, a foldable display device is folded with reference to a folding axis, which extends in one direction. However, in the foldable display device, unforeseen problems, such as deformation of the folding portion and damage of elements of the folding portion, arise, and thus, development of a technology to solve the problems is desired.

Exemplary embodiments of the invention provide a display device capable of preventing a folding area from being deformed.

An exemplary embodiment of the invention provides a display device including a display module including a first non-folding area, a folding area, and a second non-folding area, which are arranged in a first direction, a cushion layer disposed under the display module, and a supporter disposed under the cushion layer. The folding area is disposed between the first non-folding area and the second non-folding area. A groove that overlaps the folding area and extends in a second direction crossing the first direction is defined in the cushion layer.

An exemplary embodiment of the invention provides a display device including a display module including a first non-folding area, a folding area, and a second non-folding area, which are arranged in a first direction, a cushion layer disposed under the display module, and a supporter disposed under the cushion layer. The folding area is disposed between the first non-folding area and the second non-folding area. The cushion layer includes a protrusion that protrudes from an upper surface of the cushion layer which overlaps the folding area and extends in a second direction crossing the first direction. An exemplary embodiment of the invention provides a display device including a display module including a first non-folding area, a folding area, and a second non-folding area, which are arranged in a first direction, a cushion layer disposed under the display module, and a supporter disposed under the cushion layer. The folding area is disposed between the first non-folding area and the second non-folding area. An upper surface of the cushion layer which overlaps the folding area has an opposite shape to a deformation shape of a folding area of a test display module, the test display module having a same structure as the display module and folded or unfolded several times.

According to the above, since the upper surface of the cushion layer disposed under the display module has the opposite shape to the deformation shape of the folding area of the test display module having the same configuration as the display module, the deformation of the folding area of the display module may be improved.

BRIEF DESCRIPTION OF THE DRAWINGS

The above and other advantages of the invention will become readily apparent by reference to the following detailed description when considered in conjunction with the accompanying drawings, in which.

DETAILED DESCRIPTION

Figure 1:
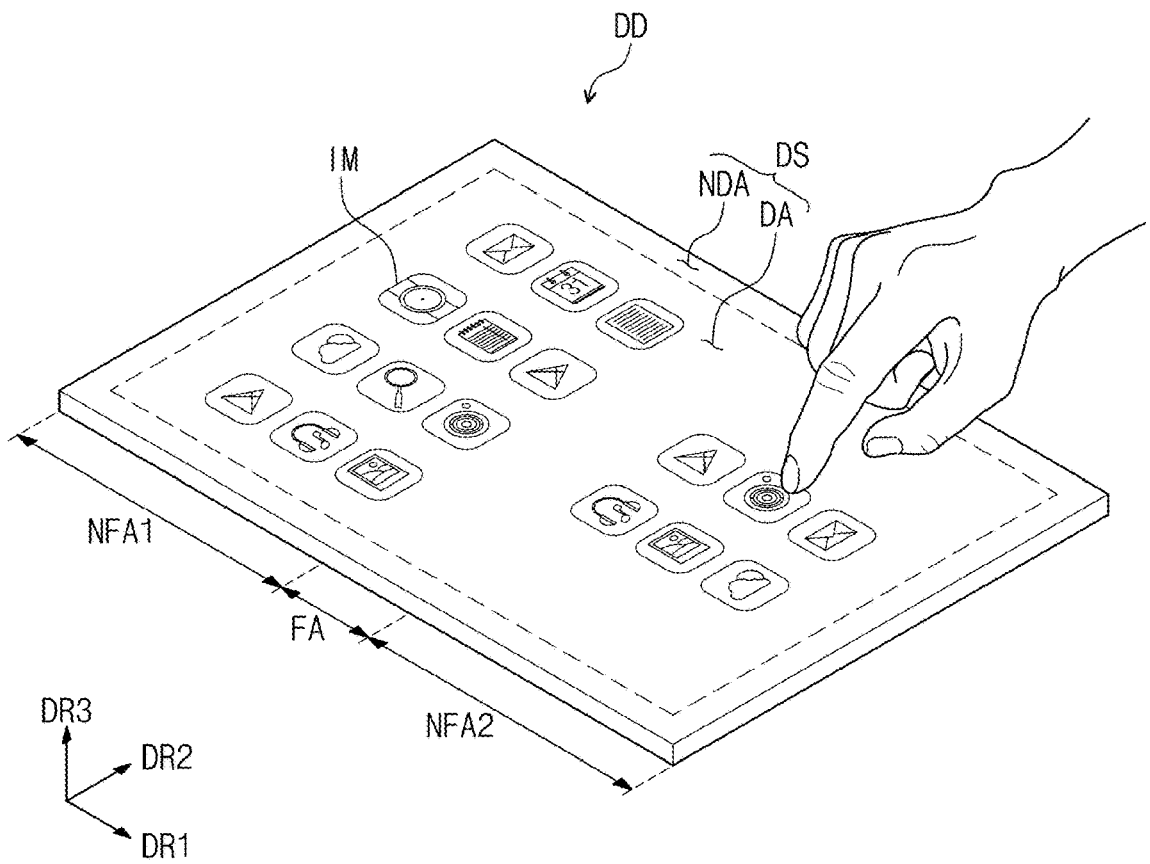
FIG. 1 is a perspective view showing an exemplary embodiment of a display device according to the invention.

In the invention, it will be understood that when an element or layer is referred to as being "on", "connected to" or "coupled to" another element or layer, it may be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the invention. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the drawing figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the invention will be explained in detail with reference to the accompanying drawings.

Figure 2:
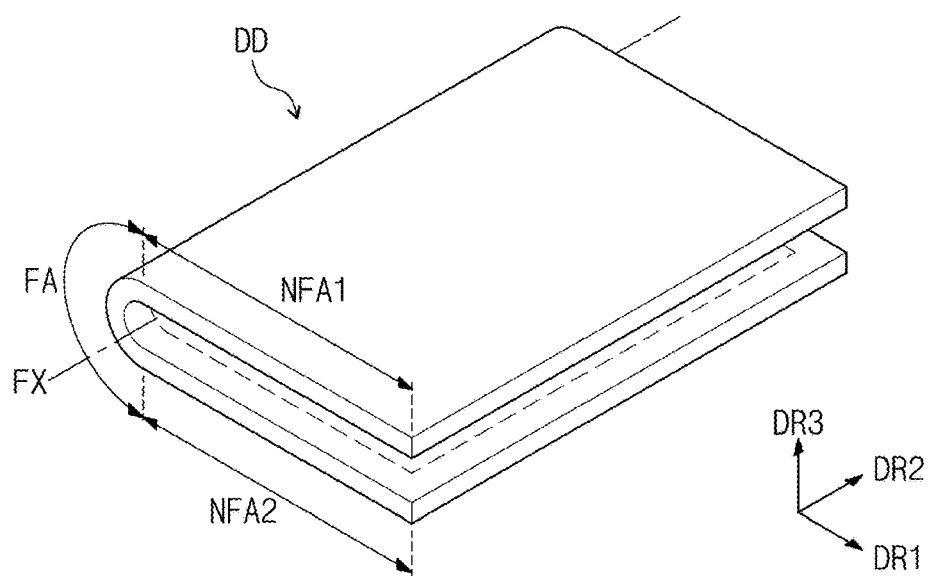
FIG. 2 is a perspective view showing an exemplary embodiment of a folded state of the display device shown in FIG. 1.

FIG. 1 is a perspective view showing an exemplary embodiment of a display device DD according to the invention. FIG. 2 is a perspective view showing a folded state of the display device DD shown in FIG. 1.

Referring to FIG. 1, the display device DD in the exemplary embodiment of the invention may have a rectangular shape defined by long sides extending in a first direction DR1 and short sides extending in a second direction DR2 crossing the first direction DR1. However, the shape of the display device DD should not be limited to the rectangular shape, and the display device DD may have various shapes, such as a circular shape and a polygonal shape. The display device DD may be a flexible display device.

Hereinafter, a direction substantially perpendicular to a surface defined by the first direction DR1 and the second direction DR2 may be referred to as a "third direction DR3". In the invention, the expression "in a plan view" may mean a state of being viewed in the third direction DR3.

The display device DD may include a first non-folding area NFA1, a second non-folding area NFA2, and a folding area FA disposed between the first non-folding area NFA1 and the second non-folding area NFA2. The first non-folding area NFA1, the second non-folding area NFA2, and the folding area FA may be arranged in the first direction DR1.

In the illustrated exemplary embodiment, one folding area FA and two non-folding areas NFA1 and NFA2 are shown, however, the number of the folding areas FA and the number of non-folding areas NFA1 and NFA2 should not be limited thereto or thereby. In an exemplary embodiment, the display device DD may include more than two non-folding areas and a plurality of folding areas disposed between the non-folding areas, for example.

An upper surface of the display device DD may be also referred to as a "display surface DS" and may be a plane surface defined by the first direction DR1 and the second direction DR2. Images IM generated by the display device DD may be provided to a user through the display surface DS.

The display surface DS may include a display area DA and a non-display area NDA around the display area DA. The display area DA displays the image, and the non-display area NDA does not display the image. The non-display area NDA surrounds the display area DA and defines an edge of the display device DD, which is printed by a predetermined color.

Referring to FIG. 2, the display device DD may be, but not limited to, a foldable display device DD that is folded or unfolded. The folding area FA may be folded with reference to a folding axis FX substantially parallel to the second direction DR2, and thus, the display device DD may be folded. The folding axis FX may be defined as a short axis substantially parallel to the short sides of the display device DD.

When the display device DD is folded, the first non-folding area NFA1 and the second non-folding area NFA2 face each other, and thus, the display device DD may be inwardly folded (in-folding) such that the display surface DS is not exposed to the outside.

Figure 3:
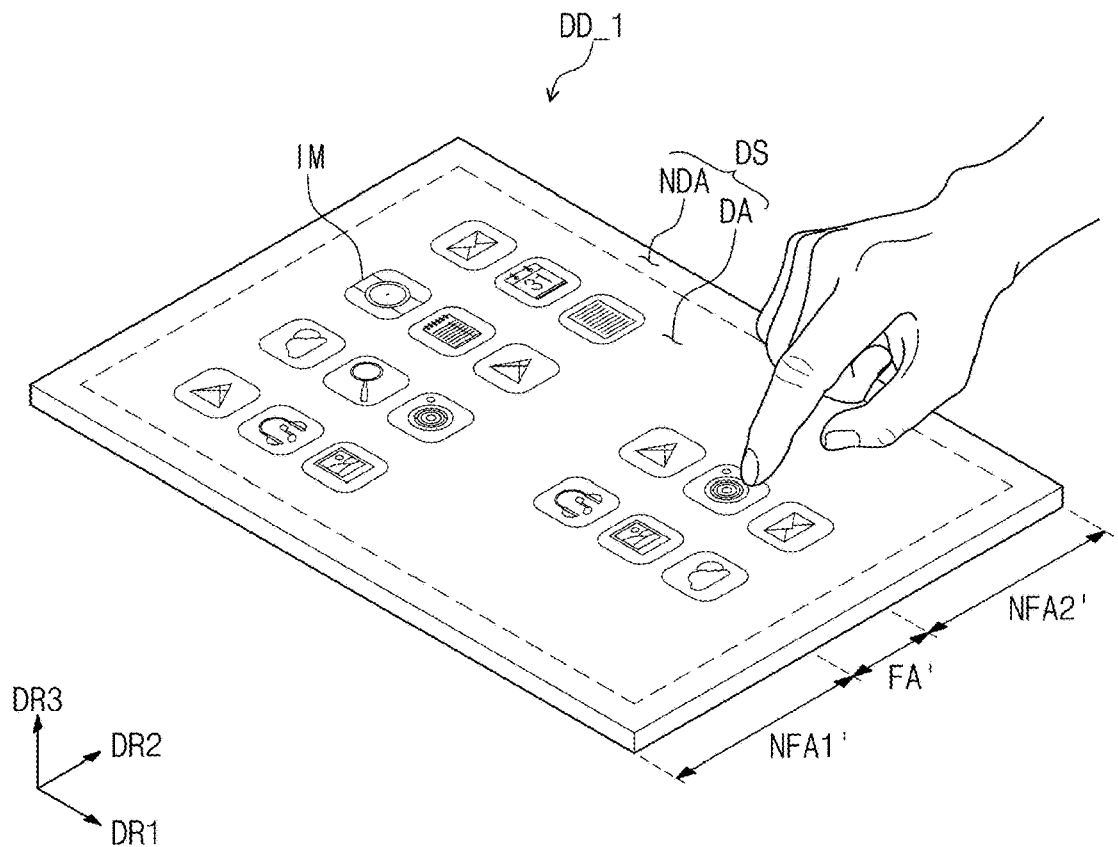
FIG. 3 is a perspective view showing an exemplary embodiment of a display device according to the invention.
Figure 4:
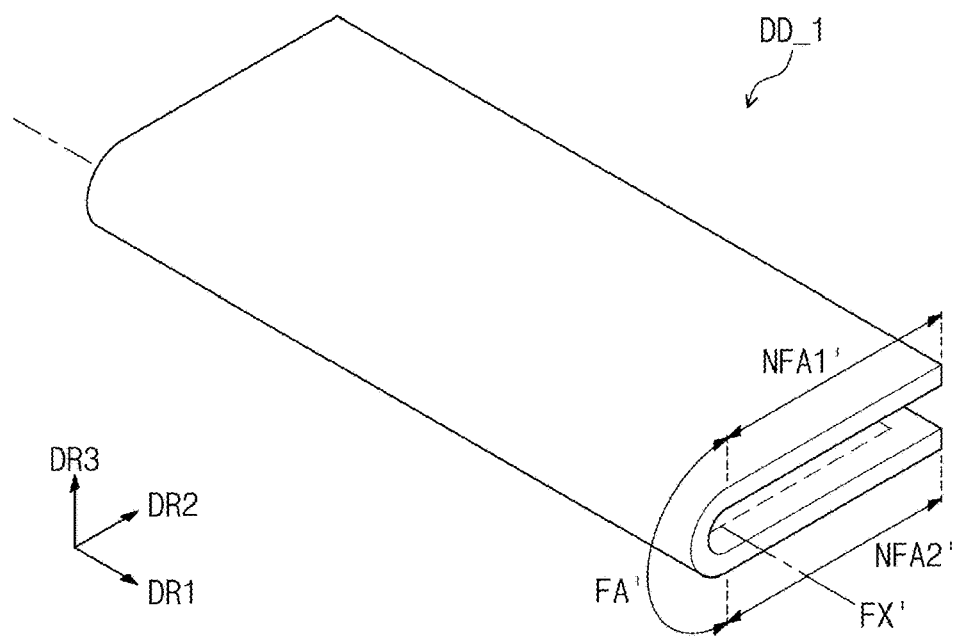
FIG. 4 is a perspective view showing a folded state of the display device shown in FIG. 3.

FIG. 3 is a perspective view showing an exemplary embodiment of a display device DD_1 according to the invention. FIG. 4 is a perspective view showing a folded state of the display device DD-1 shown in FIG. 3.

The display device DD_1 shown in FIG. 3 may have the same configurations as those of the display device DD shown in FIG. 1 except for a folding operation. Accordingly, the folding operation of the display device DD_1 will be mainly described below.

Referring to FIGS. 3 and 4, the display device DD_1 may include a first non-folding area NFA1', a second non-folding area NFA2', and a folding area FA' disposed between the first non-folding area NFA1' and the second non-folding area NFA2'. The first non-folding area NFA1', the second non-folding area NFA2', and the folding area FA' may be arranged in the second direction DR2.

The folding area FA' is folded with reference to a folding axis FX' substantially parallel to the first direction DR1, and thus, the display device DD_1 is folded. The folding axis FX' may be defined as a long axis substantially parallel to the long sides of the display device DD_1. The display device DD shown in FIG. 1 may be folded with reference to the short axis, and the display device DD_1 shown in FIG. 3 may be folded with reference to the long axis. The display device DD_1 may be inwardly folded (i.e., in-folding) such that the display surface DS is not exposed to the outside.

Hereinafter, the structure of the display device DD folded with reference to the short axis will be described, however, structures described hereinafter may be applied to the display device DD_1 folded with reference to the long axis.

Figure 5:
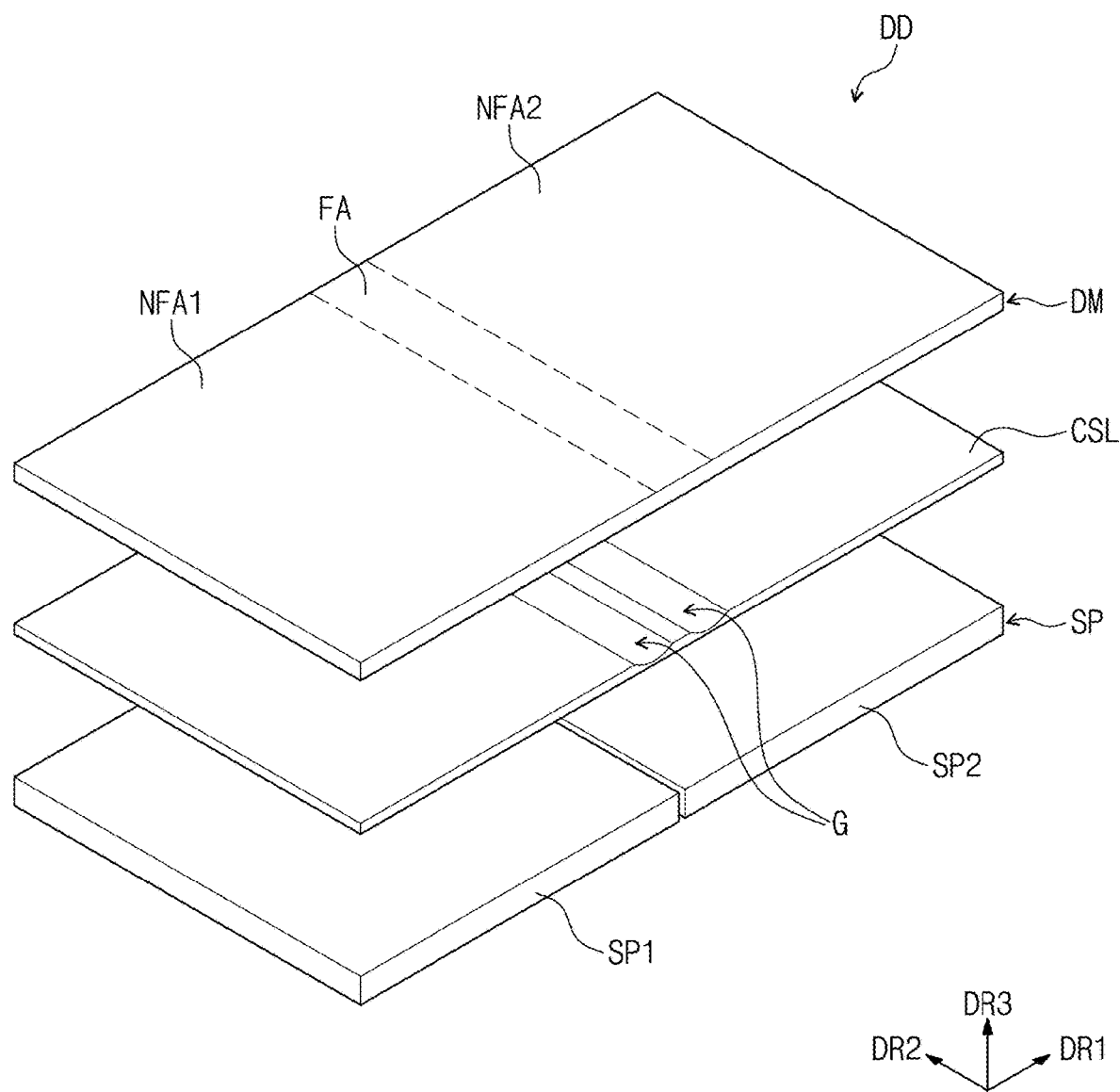
FIG. 5 is an exploded perspective view showing a display device according to the invention.

FIG. 5 is an exploded perspective view showing an exemplary embodiment of the display device DD according to the invention.

Referring to FIG. 5, the display device DD in the exemplary embodiment of the invention may include a display module DM, a cushion layer CSL disposed under the display module DM, and a supporter SP disposed under the cushion layer CSL. Although not shown in drawing figures, the display device DD may further include a case (or a housing) to accommodate the display module DM, the cushion layer CSL, and the supporter SP.

The display module DM may have a rectangular shape with long sides extending in the first direction DR1 and short sides extending in the second direction DR2. The display module DM may include the first non-folding area NFA1, the second non-folding area NFA2, and the folding area FA disposed between the first non-folding area NFA1 and the second non-folding area NFA2. The first non-folding area NFA1, the second non-folding area NFA2, and the folding area FA may be arranged in the first direction DR1.

The cushion layer CSL may have a rectangular shape with long sides extending in the first direction DR1 and short sides extending in the second direction DR2. The cushion layer CSL may absorb external impacts applied to a lower portion of the display module DM to protect the display module DM. The cushion layer CSL may include a polyurethane or acrylic sheet. The cushion layer CSL may include a foam sheet having a predetermined elasticity.

A plurality of grooves G extending in the second direction DR2 and spaced apart from each other in the first direction DR1 may be defined in the cushion layer CSL. The grooves G may be defined in an upper surface of the cushion layer CSL which faces a lower surface of the display module DM. The grooves G may overlap the folding area FA. A lower surface of the cushion layer CSL, which is opposite to the upper surface of the cushion layer CSL, may be a flat surface defined by the first and second directions DR1 and DR2.

In the illustrated exemplary embodiment of FIG. 5, two grooves G are shown, however, the number of the grooves G should not be limited to two. That is, one or three or more grooves G may be defined in the cushion layer CSL. In other words, at least one groove G may be defined in the cushion layer CSL.

The supporter SP may support the cushion layer CSL and the display module DM under the cushion layer CSL. The supporter SP may be rigid to support the cushion layer CSL and the display module DM. In an exemplary embodiment, the supporter SP may include a metal material, for example. The supporter SP may include a first supporter SP1 overlapping the first non-folding area NFA1 and a second supporter SP2 overlapping the second non-folding area NFA2 in a plan view.

Figure 6:
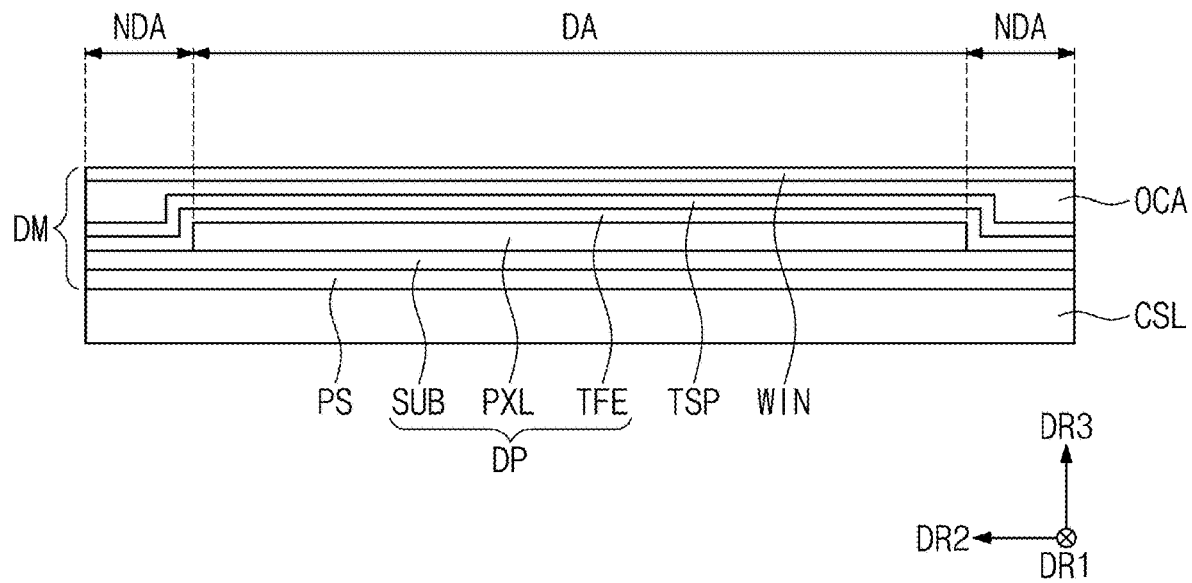
FIG. 6 is a cross-sectional view schematically showing a display module shown in FIG. 5.

FIG. 6 is a cross-sectional view schematically showing the display module shown in FIG. 5.

For the convenience of explanation, the cushion layer CSL is shown together with the display module DM in FIG. 6.

Referring to FIG. 6, the display module DM may include a display panel DP, a touch sensing unit TSP disposed on the display panel DP, a window WIN disposed on the touch sensing unit TSP, an adhesive OCA disposed between the touch sensing unit TSP and the window WIN, and a protective substrate PS disposed under the display panel DP.

An exemplary embodiment of the display panel DP according to the invention may be a light emitting type display panel, however, it should not be particularly limited. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Hereinafter, the organic light emitting display panel will be described as an illustrated exemplary embodiment of the display panel DP.

The display panel DP may include a substrate SUB, a pixel layer PXL disposed on the substrate SUB, and a thin film encapsulation layer TFE disposed on the substrate SUB to cover the pixel layer PXL. The substrate SUB may include a flexible plastic substrate that is transparent. In an exemplary embodiment, the substrate SUB may include polyimide ("PI"), for example. The substrate SUB may include a display area DA and a non-display area NDA around the display area DA as the display surface DS of the display device DD.

The pixel layer PXL may be disposed on the display area DA. The pixel layer PXL may include a plurality of pixels, and each of the pixels may include a light emitting device. The structure of the pixel will be described in detail later.

The thin film encapsulation layer TFE may include at least two inorganic layers and an organic layer disposed between the inorganic layers. The inorganic layers may include an inorganic material and may protect the pixel layer PXL from moisture and oxygen. The organic layer may include an organic material and may protect the pixel layer PXL from a foreign substance, such as dust particles.

The protective substrate PS may be disposed under and attached to the substrate SUB. A pressure sensitive adhesive may be used to attach the protective substrate PS to the substrate SUB. The protective substrate PS may protect a lower portion of the display panel DP. The lower portion of the display panel DP may be defined by the substrate SUB. The protective substrate PS may include a flexible plastic substrate. In an exemplary embodiment, the protective substrate PS may include polyethylene terephthalate ("PET"), for example.

The touch sensing unit TSP may sense an external input by a user's finger or a touch pen, may convert the sensed input to a predetermined input signal, and may provide the input signal to the display panel DP. The touch sensing unit TSP may include a plurality of touch sensor units (not shown) to sense the external input. The touch sensor units may sense the external input by a capacitive method. The display panel DP may receive the input signal from the touch sensing unit TSP and may generate an image corresponding to the input signal.

The window WIN may protect the display panel DP and the touch sensing unit TSP from external scratches and impacts. The window WIN may be attached to the touch sensing unit TSP by the adhesive OCA. The adhesive OCA may include an optically clear adhesive. The image generated by the display panel DP may be provided to the user after passing through the window WIN.

The cushion layer CSL may be attached to a lower portion of the display module DM. In an exemplary embodiment, the cushion layer CSL may be disposed under the protective substrate PS and may be attached to the lower portion of the protective substrate PS by an adhesive, for example. A pressure sensitive adhesive may be used to attach the cushion layer CSL to the protective substrate PS.

Figure 7:
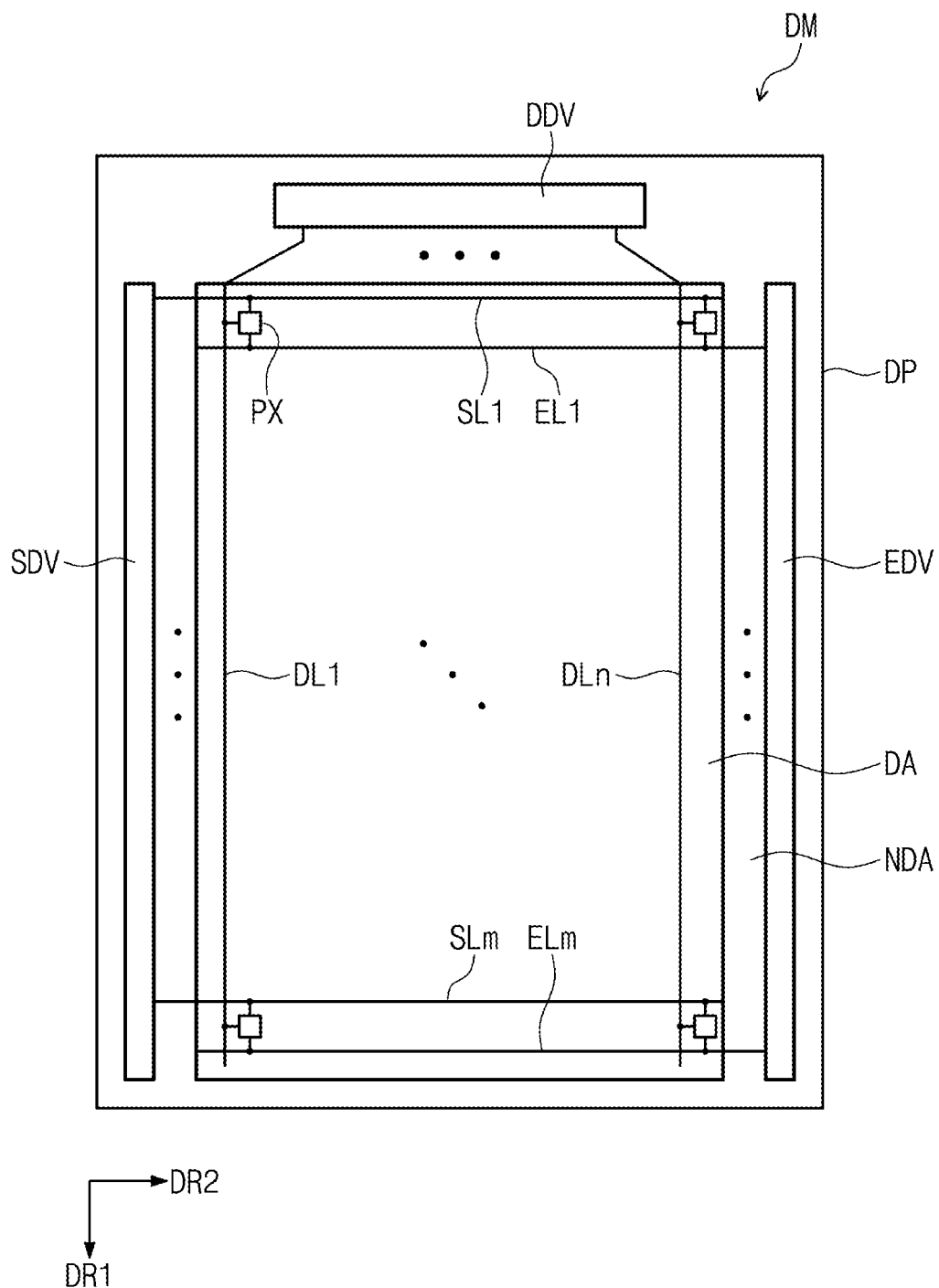
FIG. 7 is a plan view showing the display module shown in FIG. 6.

FIG. 7 is a plan view showing the display module DM shown in FIG. 6.

Referring to FIG. 7, the display module DM in the exemplary embodiment of the invention may include the display panel DP, a scan driver SDV, a data driver DDV, and an emission driver EDV. FIG. 7 shows a configuration of the display panel DP in a plan view, and the planar configuration of the touch sensing unit TSP is omitted.

The display panel DP may be a flexible display panel. The display panel DP may have a rectangular shape having long sides extending in the first direction DR1 and short sides extending in the second direction DR2. The display panel DP may include a display area DA and a non-display area NDA surrounding the display area DA as the display surface DS of the display device DD.

The display panel DP may include a plurality of pixels PX, a plurality of scan lines SL1 to SLm, a plurality of data lines DL1 to DLn, and a plurality of light emitting lines EL1 to ELm. Each of "m" and "n" is a natural number. The pixels PX may be arranged in a matrix form, however, they should not be limited thereto or thereby. The pixels PX may be arranged in the display area DA and may be connected to the scan lines SL1 to SLm, the data lines DL1 to DLn, and the light emitting lines EL1 to ELm.

The scan driver SDV, the data driver DDV, and the emission driver EDV may be arranged in the non-display area NDA. The scan driver SDV and the emission driver EDV may be disposed to be respectively adjacent to the long sides of the display panel DP. The data driver DDV may be manufactured in an integrated circuit ("IC") chip form and may be disposed to be adjacent to one short side of the short sides of the display panel DP.

The scan lines SL1 to SLm may extend in the second direction DR2 and may be connected to the scan driver SDV. The data lines DL1 to DLn may extend in the first direction DR1 and may be connected to the data driver DDV. The light emitting lines EL1 to ELm may extend in the second direction DR2 and may be connected to the emission driver EDV.

The scan driver SDV may generate a plurality of scan signals, and the scan signals may be applied to the pixels PX through the scan lines SL1 to SLm. The scan signals may be sequentially applied to the pixels PX. The data driver DDV may generate a plurality of data voltages, and the data voltages may be applied to the pixels PX through the data lines DL1 to DLn. The emission driver EDV may generate a plurality of light emitting signals, and the light emitting signals may be applied to the pixels PX through the light emitting lines EL1 to ELm.

Although not shown in drawing figures, the display module DM may include a timing controller (not shown) to control an operation of the scan driver SDV, the data driver DDV, and the emission driver EDV.

The pixels PX may receive the data voltages in response to the scan signals. The pixels PX may emit light having luminance corresponding to the data voltages in response to the light emitting signals to display the image. A light emitting time of the pixels PX may be controlled by the light emitting signals.

Figure 8:
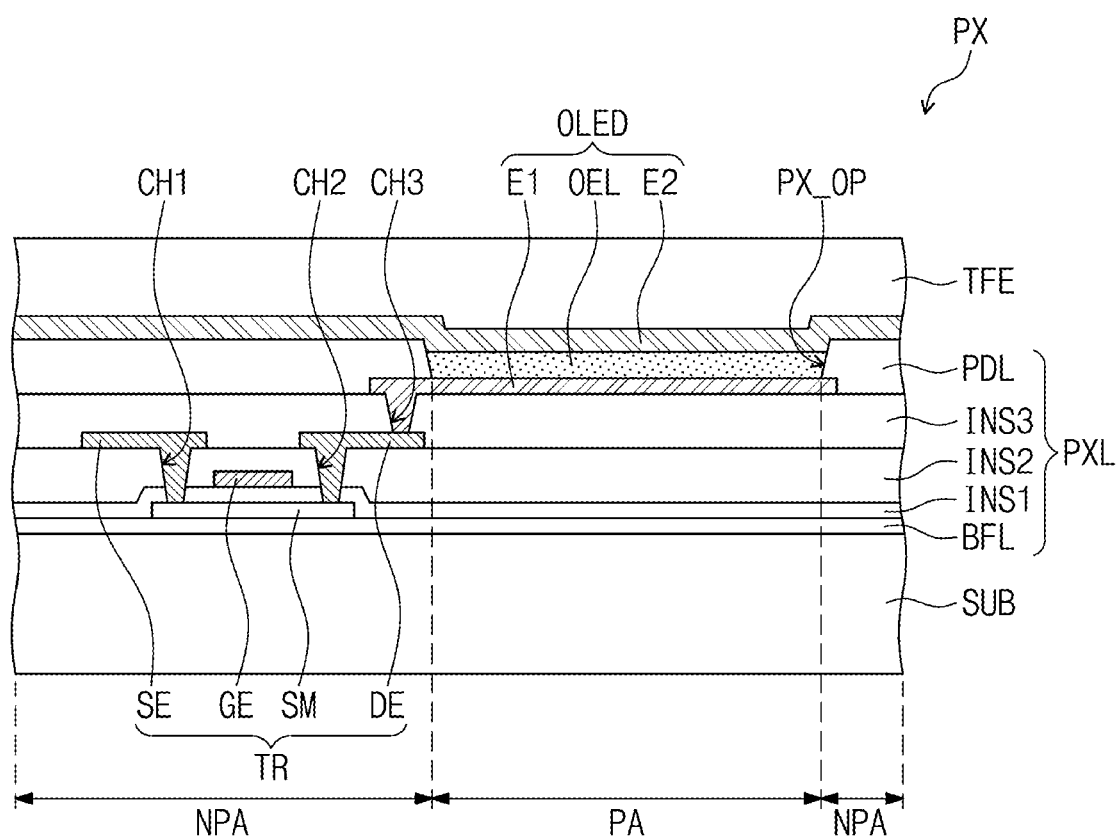
FIG. 8 is a cross-sectional view showing a pixel shown in FIG. 7.

FIG. 8 is a cross-sectional view showing a pixel shown in FIG. 7.

Referring to FIG. 8, the pixel PX may include an organic light emitting device OLED and a transistor TR connected to the organic light emitting device OLED. The organic light emitting device OLED may include a first electrode E1, a second electrode E2, and an organic light emitting layer OEL disposed between the first electrode E1 and the second electrode E2.

The first electrode E1 may be an anode electrode, and the second electrode E2 may be a cathode electrode. The first electrode E1 may be also referred to as the "pixel electrode", and the second electrode E2 may be also referred to as the "common electrode".

The pixel PX may include a pixel area PA and a non-pixel area NPA around the pixel area PA. The organic light emitting device OLED may be disposed in the pixel area PA, and the transistor TR may be disposed in the non-pixel area NPA. The transistor TR and the organic light emitting device OLED may be disposed on the substrate SUB. A buffer layer BFL may be disposed on the substrate SUB, and the buffer layer BFL may include an inorganic material.

A semiconductor layer SM of the transistor TR may be disposed on the buffer layer BFL. The semiconductor layer SM may include an inorganic semiconductor, such as amorphous silicon or polycrystalline silicon, or an organic semiconductor. In addition, the semiconductor layer SM may include an oxide semiconductor. Although not shown in FIG. 8, the semiconductor layer SM may include a source area, a drain area, and a channel area defined between the source area and the drain area.

A first insulating layer INS1 may be disposed on the buffer layer BFL to cover the semiconductor layer SM. The first insulating layer INS1 may include an inorganic material. A gate electrode GE of the transistor TR may be disposed on the first insulating layer INS1 to overlap the semiconductor layer SM. The gate electrode GE may be disposed to overlap the channel area of the semiconductor layer SM.

A second insulating layer INS2 may be disposed on the first insulating layer INS1 to cover the gate electrode GE. The second insulating layer INS2 may include an organic material and/or an inorganic material.

A source electrode SE and a drain electrode DE of the transistor TR may be disposed on the second insulating layer INS2 to be spaced apart from each other. The source electrode SE may be connected to the source area of the semiconductor layer SM through a first contact hole CH1 defined through the first insulating layer INS1 and the second insulating layer INS2. The drain electrode DE may be connected to the drain area of the semiconductor layer SM through a second contact hole CH2 defined through the first insulating layer INS1 and the second insulating layer INS2.

A third insulating layer INS3 may be disposed on the second insulating layer INS2 to cover the source electrode SE and the drain electrode DE of the transistor TR. The third insulating layer INS3 may be also referred to as a "planarization layer" that provides a flat upper surface and may include an organic material.

The first electrode E1 may be disposed on the third insulating layer INS3. The first electrode E1 may be connected to the drain electrode DE of the transistor TR through a third contact hole CH3 defined through the third insulating layer INS3.

A pixel definition layer PDL may be disposed on the first electrode E1 and the third insulating layer INS3 to expose a predetermined portion of the first electrode E1. An opening PX_OP may be defined through the pixel definition layer PDL to expose the predetermined portion of the first electrode E1.

The organic light emitting layer OEL may be disposed on the first electrode E1 in the opening PX_OP. The organic light emitting layer OEL may generate a light having one of red, green, and blue colors, however, it should not be limited thereto or thereby. The organic light emitting layer OEL may generate a white light by a combination of organic materials respectively generating the red, green, and blue colors.

The second electrode E2 may be disposed on the pixel definition layer PDL and the organic light emitting layer OEL. The thin film encapsulation layer TFE may be disposed on the second electrode E2. A layer disposed between the substrate SUB and the thin film encapsulation layer TFE may be also referred to as the pixel layer PXL.

A first voltage may be applied to the first electrode E1, and a second voltage may be applied to the second electrode E2. Holes and electrons injected into the organic light emitting layer OEL may be recombined to generate excitons, and the organic light emitting device OLED may emit the light by the excitons that return to a ground state from an excited state. The organic light emitting device OLED may emit red, green, and blue lights in accordance with the current flow, so that the image may be displayed.

Figure 9:
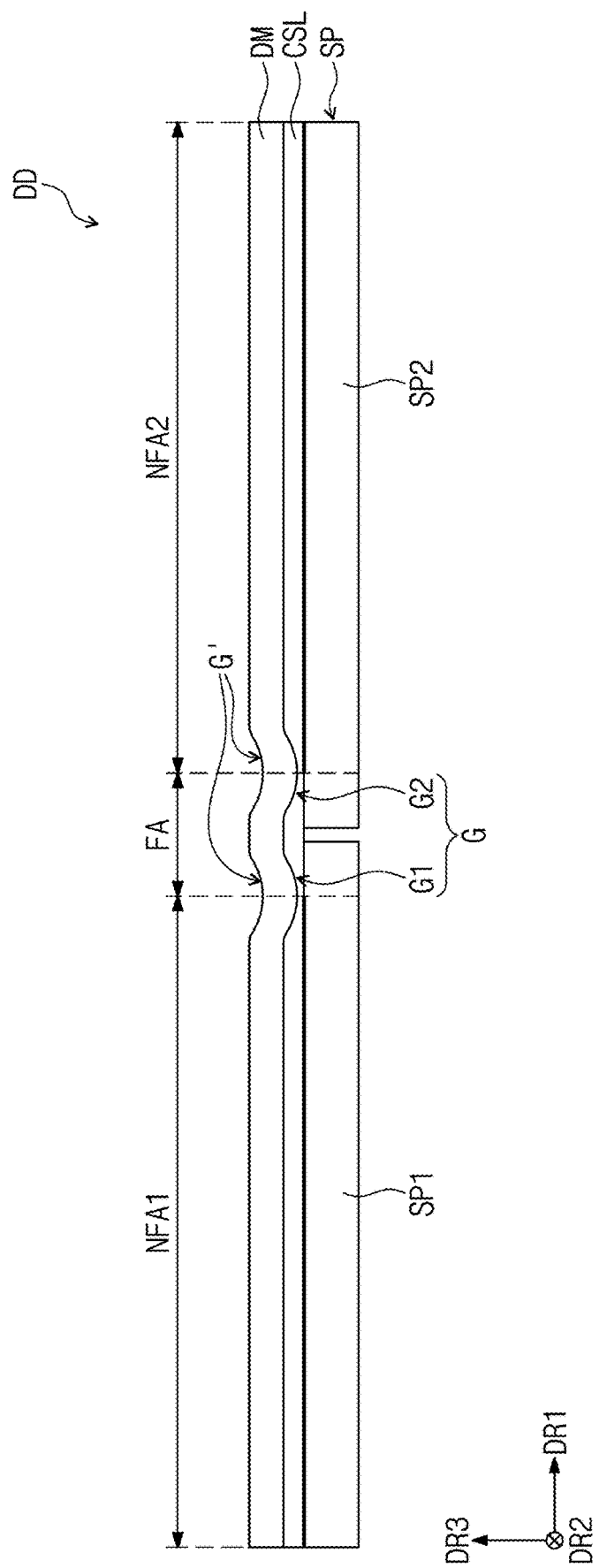
FIG. 9 is a side view showing the display device shown in FIG. 5 in a second direction.
Figure 10:
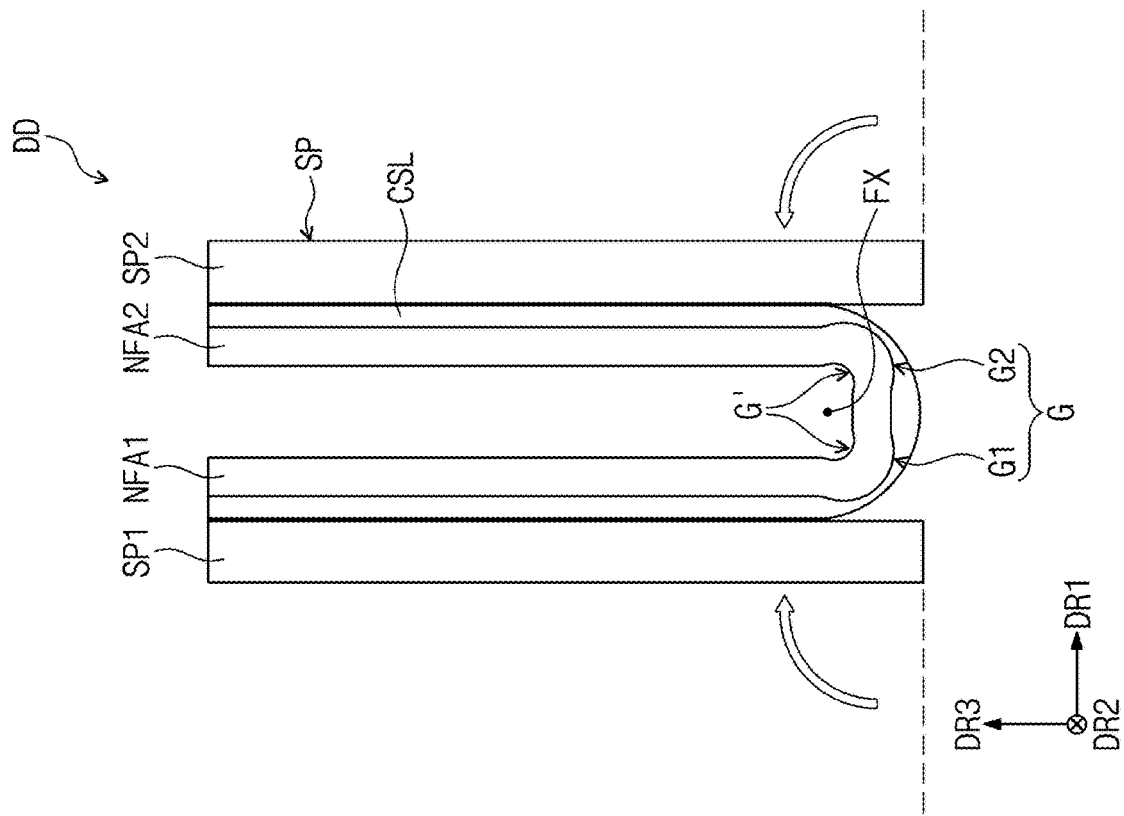
FIG. 10 is a view showing a folded state of the display device shown in FIG. 9.

FIG. 9 is a side view showing the display device DD shown in FIG. 5 in the second direction. FIG. 10 is a view showing a folded state of the display device DD shown in FIG. 9.

Referring to FIG. 9, the display module DM may be attached to the cushion layer CSL, and portions of the display module DM which overlap the grooves G of the cushion layer CSL may be recessed downward by a depth of the grooves G. Accordingly, grooves G' overlapping the grooves G and having a shape corresponding to the grooves G may be defined in the upper surface of the display module DM.

The grooves G may include a first groove G1 and a second groove G2, which are spaced apart from each other in the first direction DR1 and extend in the second direction DR2. In a plan view, the first groove G1 may overlap a portion of the folding area FA and a portion of the first non-folding area NFA1 adjacent to the folding area FA. In a plan view, the second groove G2 may overlap a portion of the folding area FA and a portion of the second non-folding area NFA2 adjacent to the folding area FA.

In a plan view, the first supporter SP1 may overlap the first non-folding area NFA1 and a portion of the folding area FA adjacent to the first non-folding area NFA1. In a plan view, the second supporter SP2 may overlap the second non-folding area NFA2 and a portion of the folding area FA adjacent to the second non-folding area NFA2.

The supporter SP may be attached to the cushion layer CSL. In an exemplary embodiment, the first supporter SP1 may be attached to a portion of the cushion layer CSL which overlaps the first non-folding area NFA1, for example. The second supporter SP2 may be attached to a portion of the cushion layer CSL which overlaps the second non-folding area NFA2. In FIG. 9, upper surfaces of the first and second supporters SP1 and SP2, which are attached to the cushion layer CSL, are indicated by a bold line. The pressure sensitive adhesive may be used to attach the first and second supporters SP1 and SP2 to the cushion layer CSL.

The portion of the first supporter SP1 which overlaps the folding area FA and the portion of the second supporter SP2 which overlaps the folding area FA may not be attached to the portion of the cushion layer CSL which overlaps the folding area FA.

Referring to FIG. 10, the first supporter SP1 and the second supporter SP2 may be rotated in opposite directions from each other with respect to the folding axis FX, and thus, the display module DM may be inwardly folded such that the first non-folding area NFA1 and the second non-folding area NFA2 face each other. Since the portions of the first and second supporters SP1 and SP2 which overlap the folding area FA are not attached to the cushion layer CSL, the portions of the first and second supporters SP1 and SP2 which overlap the folding area FA may be spaced apart from the display module DM when the display module DM is folded.

Since the display module DM is a flexible display module, the folding area FA may be easily bent. However, since the first and second supporters SP1 and SP2 are the rigid type, the first and second supporters SP1 and SP2 may not be bent. In a case where the portions of the first and second supporters SP1 and SP2 which overlap the folding area FA are attached to the cushion layer CSL, the folding area FA may not be bent due to the first and second supporters SP1 and SP2, and as a result, the folding operation of the display module DM may be difficult.

In the exemplary embodiment of the invention, the portions of the first and second supporters SP1 and SP2 which overlap the folding area FA are not attached to the cushion layer CSL, and thus, the folding area FA may be easily bent.

Figure 11:
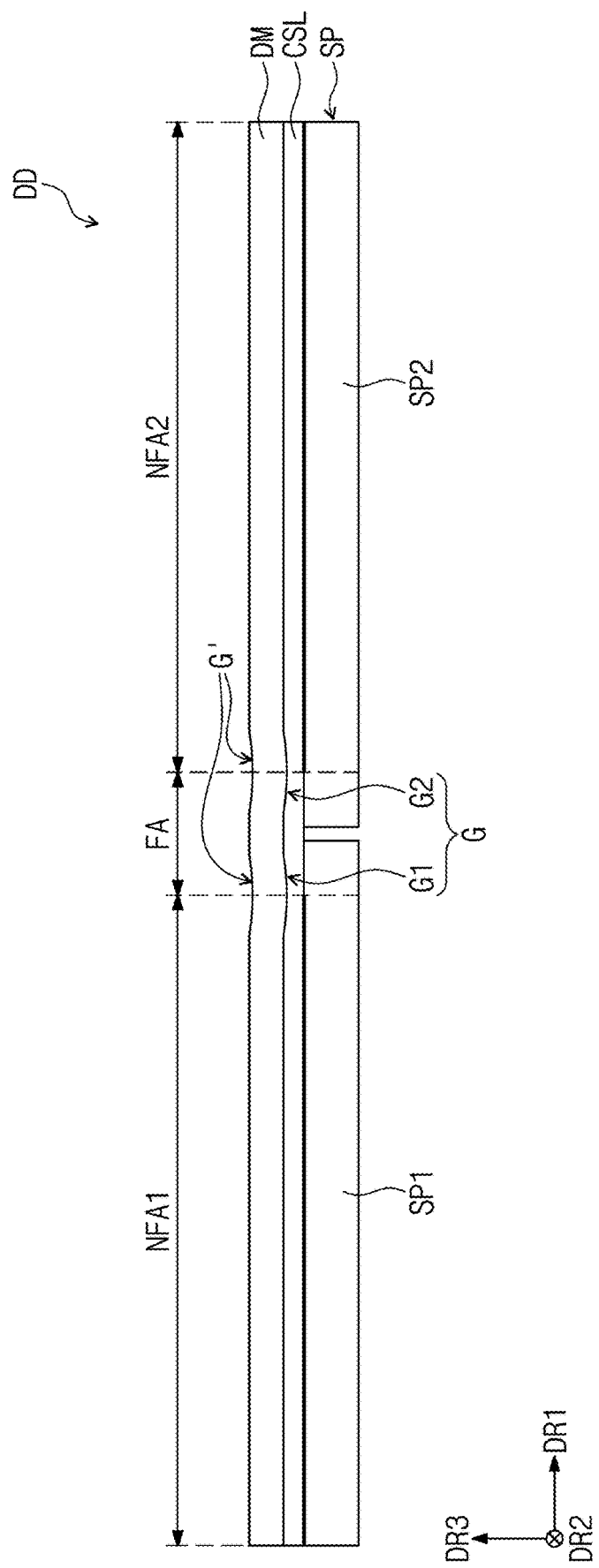
FIG. 11 is a view showing the display module shown in FIG. 9 after being folded and unfolded several times.

FIG. 11 is a view showing the display module DM shown in FIG. 9 after being folded and unfolded several times. FIGS. 12 to 15 are views explaining a reason why a flatness of the folding area FA shown in FIG. 11 is improved.

Figure 13:
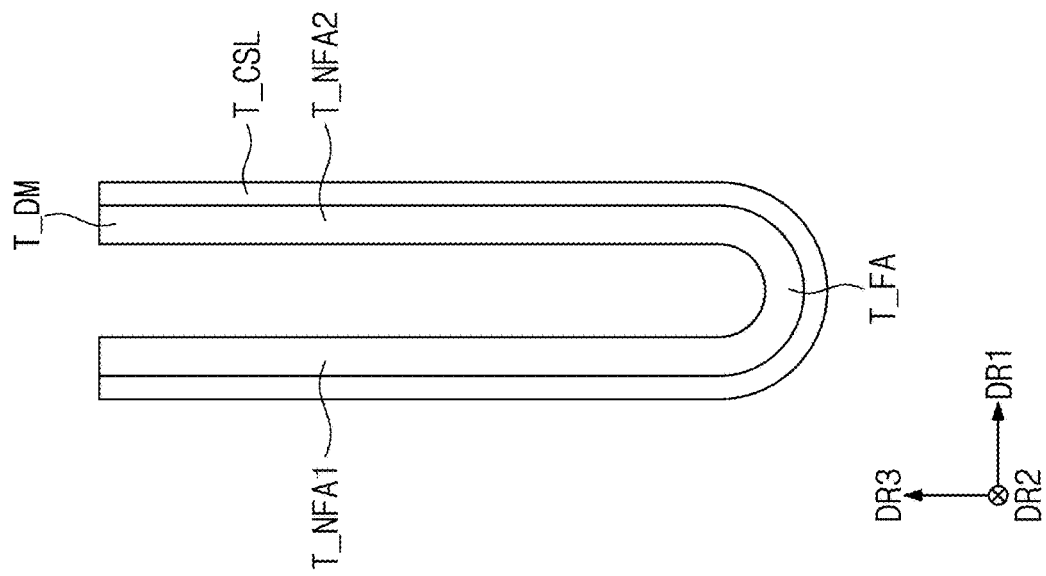
Figure 14:
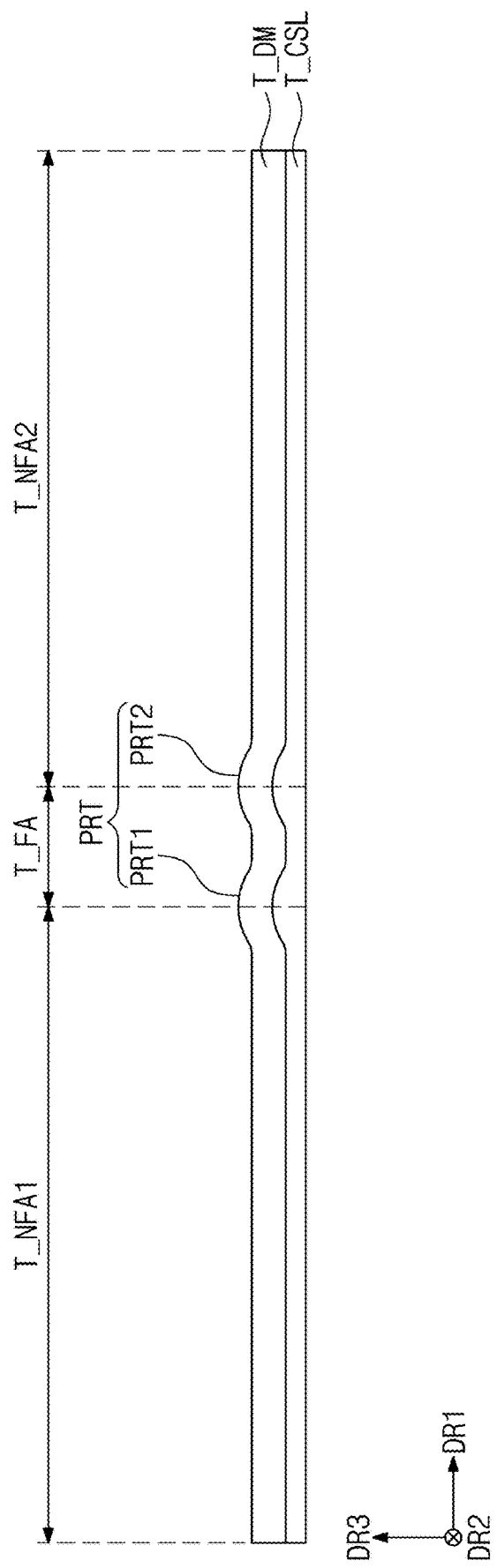
Figure 15:
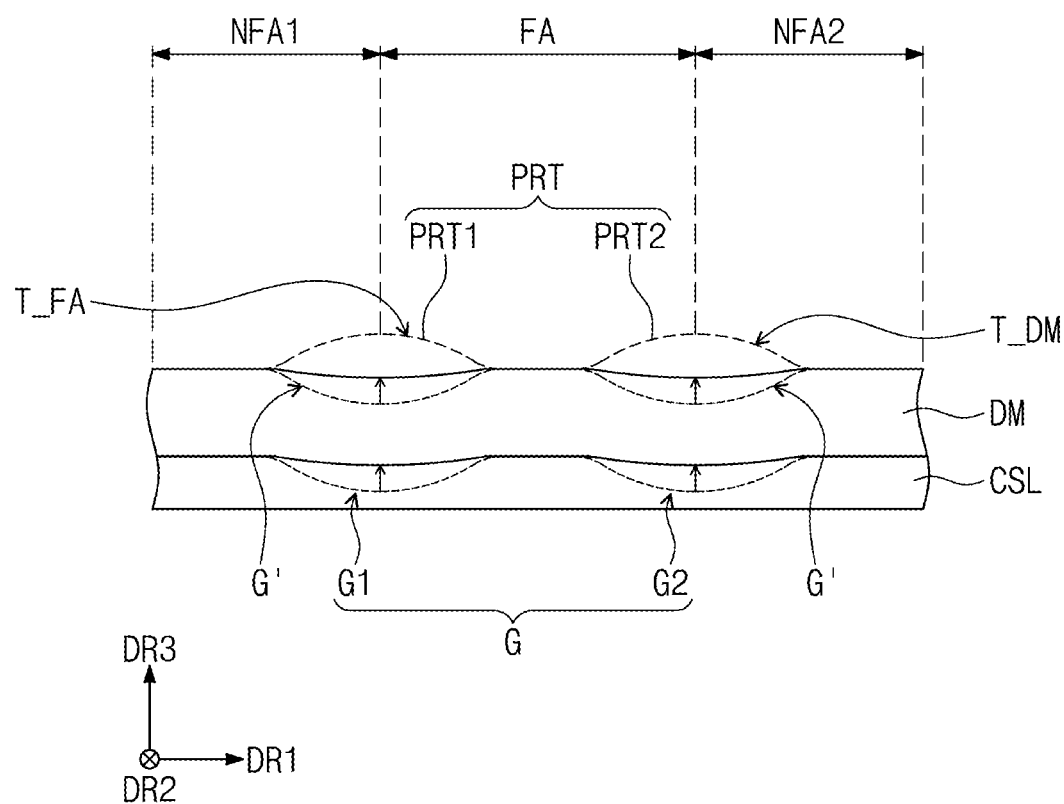

For the convenience of explanation, the supporter SP is omitted in FIGS. 12 to 15. FIG. 15 is an enlarged view showing a portion of the display device DD, which overlaps the folding area FA.

Referring to FIG. 11, the display module DM may be repeatedly folded as shown in FIG. 10 and unfolded as shown in FIG. 9. When the folding and unfolding operations are repeated, the folding area FA of the display module DM may be deformed differently from its initial state. In an exemplary embodiment, the upper surface of the display module DM in which the grooves G' are defined and the upper surface of the cushion layer CSL in which the grooves G are defined may move upwardly, for example. Therefore, the flatness of the folding area FA may be improved.

Hereinafter, the reason why the flatness of the folding area FA is improved will be described in detail with reference to FIGS. 12 to 15.

Figure 12:
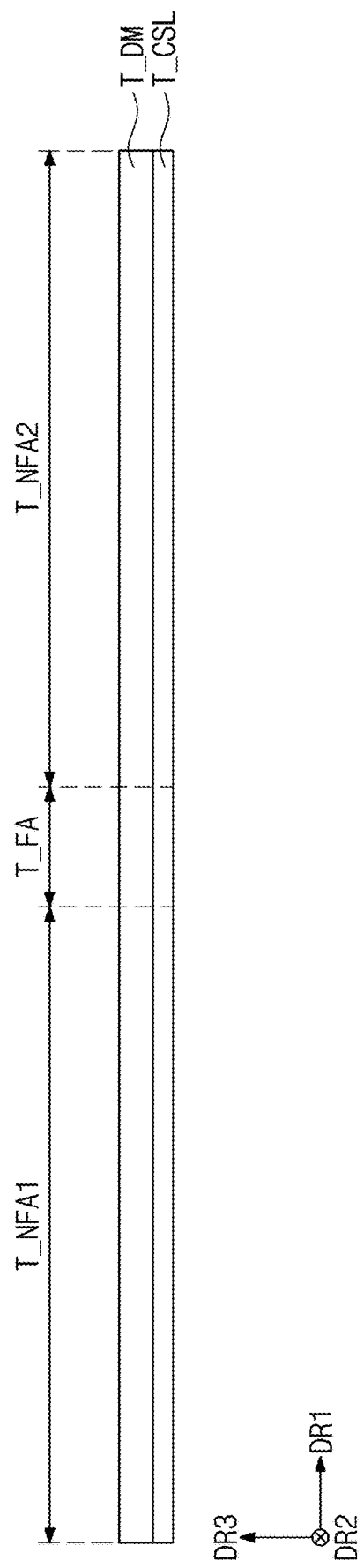
FIGS. 12 to 15 are views explaining a reason why a flatness of a folding area shown in FIG. 11 is improved.

Referring to FIG. 12, a test display module T_DM and a test cushion layer T_CSL may be prepared. The test display module T_DM may have substantially the same structure as that of the display module DM. That is, the test display module T_DM and the display module DM may be the same products. Similar to the display module DM, the test display module T_DM may include a first non-folding area T_NFA1, a second non-folding area T_NFA2, and a folding area T_FA disposed between the first non-folding area T_NFA1 and the second non-folding area T_NFA2.

The test cushion layer T_CSL may be disposed under the test display module T_DM and may be attached to the test display module T_DM. Grooves G are not defined in an upper surface of the test cushion layer T_CSL.

Referring to FIG. 13, the test display module T_DM may be folded. When the test display module T_DM is folded, a length of a circumference of an upper surface of the folding area T_FA in the folded folding area T_FA is smaller than a length of a circumference of a lower surface of the test cushion layer T_CSL overlapping the folding area T_FA in the folded folding area T_FA. In this case, a compressive stress may occur on the upper surface of the folding area T_FA.

Referring to FIGS. 12 and 13, the test display module T_DM may be folded as shown in FIG. 13 and may be unfolded as shown in FIG. 12 again. The folding and unfolding operations of the test display module T_DM may be repeated several times.

Referring to FIG. 14, in the case where the folding and unfolding operations of the test display module T_DM are repeated several times, the folding area T_FA of the test display module T_DM may be deformed. In an exemplary embodiment, the upper surface of the test display module T_DM may move upward and may be deformed due to the above-mentioned compressive stress, for example. As a result, protrusions PRT protruding from the upper surface of the folding area T_FA may be provided in the folding area T_FA. The protrusions PRT may include two protrusions, e.g., a first protrusion PRT1 and a second protrusion PRT2.

The deformation of the test display module T_DM may be large at a boundary between the folding area T_FA and the first non-folding area T_NFA1 and at a boundary between the folding area T_FA and the second non-folding area T_NFA2. The protrusions PRT may be provided at the boundary between the folding area T_FA and the first non-folding area T_NFA1 and at the boundary between the folding area T_FA and the second non-folding area T_NFA2. The upper surface of the test cushion layer T_CSL attached to the test display module T_DM may be also deformed similar to the test display module T_DM.

The display module DM and the test display module T_DM may be in a first same product group having the same structure. Accordingly, when the display module DM is repeatedly folded and unfolded, the display module DM may be deformed in the same manner as the test display module T_DM. The two protrusions, e.g., the first protrusion PRT1 and the second protrusion PRT2, provided in the folding area are shown as an illustrated example. However, one protrusion may be provided in a second same product group, and three or more protrusions may be provided in a third same product group.

The same product group may include products that are manufactured with the same manufacturing equipment, include the same pixels, have the same size, and have the same stacked structure with each other. In an exemplary embodiment, the first same product group may include display modules for use in a mobile phone, and the second same product group may include display modules for use in a tablet personal computer ("PC"). In addition, the third same product group may include display modules having a thickness smaller than that of the display modules of the first same product group.

Referring to FIG. 15, the upper surface of the cushion layer CSL of the invention may have a shape opposite to the deformed shape of the folding area T_FA of the test display module T_DM. In an exemplary embodiment, the first groove G1 having an opposite shape to that of the first protrusion PRT1 and the second groove G2 having an opposite shape to that of the second protrusion PRT2 may be defined in the upper surface of portions of the cushion layer CSL which overlap the folding area FA of the display module DM, for example.

Referring to FIGS. 11 and 15, in the case where the display module DM is folded and unfolded several times, the upper surface of the display module DM may move upward as the first and second protrusions PRT1 and PRT2 of the test display module T_DM. However, since the grooves G' are defined in the upper surface of the display module DM by the first and second grooves G1 and G2, the upper surface of the display module DM may not protrude upward as the first and second protrusions PRT1 and PRT2 even though the upper surface of the display module DM moves upward in the grooves G'.

As the upper surface of the display module DM moves upward in the grooves G', the upper surface of the cushion layer CSL may move upward in the first and second grooves G1 and G2.

The portions of the display module DM, which are to be protruded upward, may be offset by the first and second grooves G1 and G2, and as a result, the flatness of the folding area FA may be similar to the flatness of the first and second non-folding areas NFA1 and NFA2. Although the display module DM is repeatedly folded and unfolded according to the user's use, the first and second protrusions PRT1 and PRT2 may not be provided in the folding area FA. That is, the deformation of the folding area FA may be improved.

In the illustrated exemplary embodiment, two grooves, e.g., the first and second grooves G1 and G2, are defined in the cushion layer CSL, however, one groove may be defined in the cushion layer CSL in the case where one protrusion is provided in the test display module T_DM. In addition, in the case where three or more protrusions are defined in the test display module T_DM, three or more grooves may be defined in the cushion layer CSL.

Consequently, in the exemplary embodiment of the display device DD according to the invention, the cushion layer CSL may have the opposite shape to the deformed state of the folding area T_FA of the test display module T_DM, and thus, the deformation of the folding area FA of the display module DM may be improved.

Figure 16:
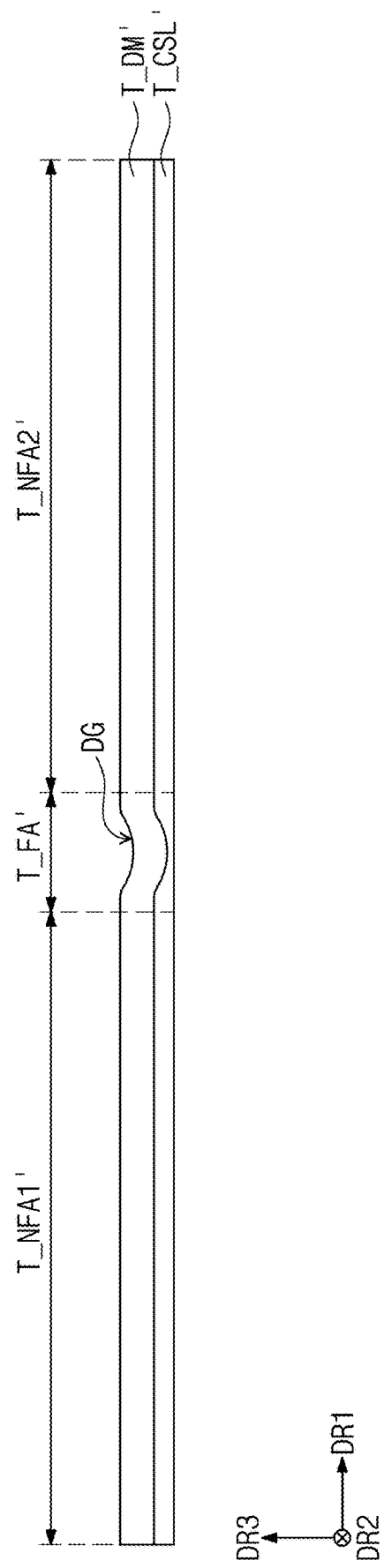
FIG. 16 is a view showing a deformed state of another test display module.
Figure 17:
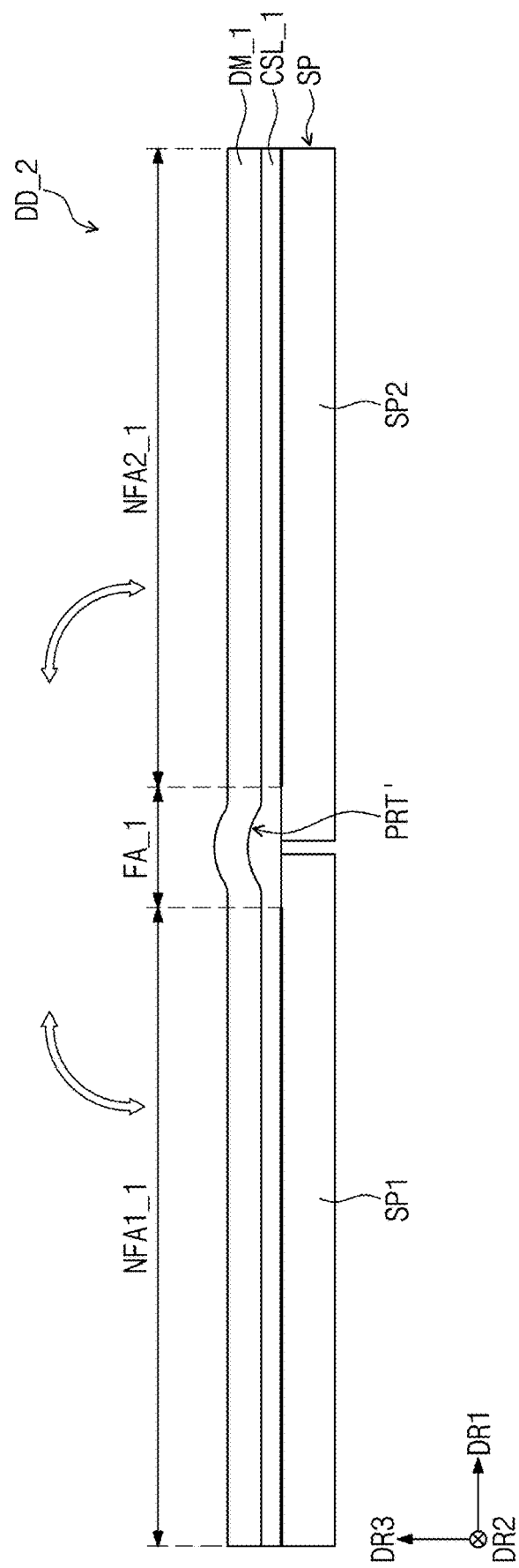
FIG. 17 is a view showing another exemplary embodiment of a display device according to the invention.
Figure 18:
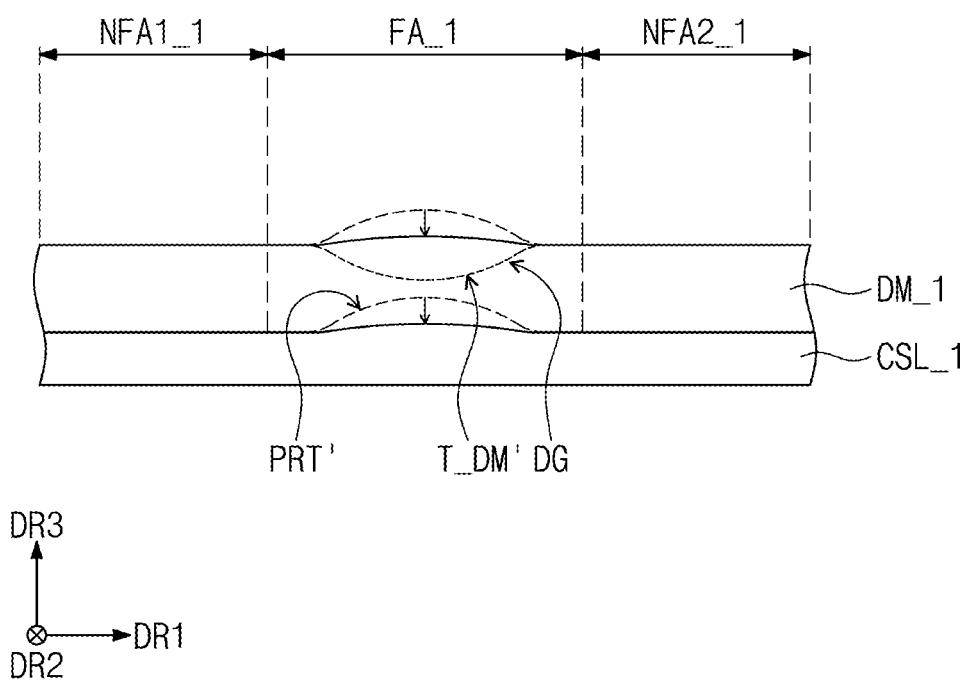
FIG. 18 is a view showing the display module shown in FIG. 17 after being folded and unfolded several times.

FIG. 16 is a view showing a deformed state of another test display module. FIG. 17 is a view showing another exemplary embodiment of a display device according to the invention. FIG. 18 is a view showing the display module shown in FIG. 17 after being folded and unfolded several times.

In detail, FIGS. 16 and 17 show side views of the test display module T_DM' and the display device DD_2 in the second direction DR2. FIG. 18 shows an enlarged view corresponding to FIG. 15.

Referring to FIG. 16, the test display module T_DM' may include a first non-folding area T_NFA1', a second non-folding area T_NFA2', and a folding area T_FA' disposed between the first non-folding area T_NFA1' and the second non-folding area T_NFA2'.

In a case where the test display module T_DM' is repeatedly folded and unfolded, the folding area T_FA' may be deformed. In an exemplary embodiment, an upper surface of the folding area T_FA' may be recessed downward, and thus, a deformation groove DG may be defined in the folding area T_FA', for example. The deformation groove DG may extend in the second direction DR2. An upper surface of a test cushion layer T_CSL', which overlaps the folding area T_FA', may be also recessed downward similar to the deformation groove DG.

Referring to FIG. 17, a display device DD_2 may include a display module DM_1, a cushion layer CSL_1 disposed under the display module DM_1, and a supporter SP disposed under the cushion layer CSL_1. The display module DM_1 may include a first non-folding area NFA1_1, a second non-folding area NFA2_1, and a folding area FA_1 disposed between the first non-folding area NFA1_1 and the second non-folding area NFA2_1.

The cushion layer CSL_1 may have an opposite shape to a deformation shape of the folding area T_FA' of the test display module T_DM'. In an exemplary embodiment, the cushion layer CSL_1 may include a protrusion PRT' that protrudes upward from a portion of the cushion layer CSL_1, which overlaps the folding area FA_1 of the display module DM_1, and has the opposite shape to the deformation groove DG, for example. The protrusion PRT' may protrude from the upper surface of the cushion layer CSL_1. The protrusion PRT' may extend in the second direction DR2.

In the case where first and second protrusions PRT1 and PRT2 are provided in the test display module T_DM, the first and second grooves G1 and G2 having the opposite shape to the first and second protrusions PRT1 and PRT2 are defined in the cushion layer CSL. On the contrary, in the case where the deformation groove DG is defined in the test display module T_DM', the cushion layer CSL_1 may include the protrusion PRT' having the opposite shape to the deformation groove DG.

In the illustrated exemplary embodiment, one protrusion PRT' corresponding to one deformation groove DG is shown, however, the number of the protrusions should not be limited thereto or thereby. That is, when a plurality of deformation grooves is defined in the test display module T_DM', the cushion layer CSL_1 may include a plurality of protrusions corresponding to the number of the deformation grooves.

Referring to FIG. 18, when the display module DM_1 is repeatedly folded and unfolded, the upper surface of the folding area FA_1 which protrudes upward due to the protrusion PRT' may move downward. Accordingly, the flatness of the folding area FA_1 may be improved. As the cushion layer CSL_1 includes the protrusion PRT' having the opposite shape to the deformation groove DG, the flatness of the folding area FA_1 may be improved even though the display module DM_1 is repeatedly folded and unfolded. Thus, the deformation of the folding area FA_1 may be improved.

Although the exemplary embodiments of the invention have been described, it is understood that the invention should not be limited to these exemplary embodiments but various changes and modifications may be made by one ordinary skilled in the art within the spirit and scope of the invention as hereinafter claimed. Therefore, the disclosed subject matter should not be limited to any single embodiment described herein, and the scope of the invention shall be determined according to the attached claims.

What is claimed is:

1. A display device comprising:
   a display module comprising a first non-folding area, a folding area, and a second non-folding area, which are arranged in a first direction, the folding area being disposed between the first non-folding area and the second non-folding area;
   a cushion layer disposed under the display module; and
   a supporter disposed under the cushion layer, wherein a groove which overlaps the folding area and mainly extends in a second direction crossing the first direction is defined in the cushion layer,
   wherein a portion of the display module is disposed in the groove,
   the groove comprises:
      a first groove extending in the second direction; and
      a second groove spaced apart from the first groove in the first direction and extending in the second direction, and
   a flat portion of the cushion layer is interposed between the first groove and the second groove.

2. The display device of claim 1, wherein the groove is defined in an upper surface of the cushion layer which faces the display module.

3. The display device of claim 1, wherein the first groove and the second groove overlap the folding area, a portion of the first non-folding area, which is adjacent to the folding area, and a portion of the second non-folding area, which is adjacent to the folding area.

4. The display device of claim 2, wherein a lower surface of the cushion layer, which is opposite to the upper surface of the cushion layer, comprises a plane defined by the first and second directions.

5. The display device of claim 1, wherein the cushion layer comprises a polyurethane, an acrylic sheet, or a foam sheet having a predetermined elasticity.

6. The display device of claim 1, wherein the cushion layer is attached to the display module.

7. The display device of claim 1, wherein the display module further comprises:
   a display panel comprising a substrate and a pixel layer disposed on the substrate; and
   a protective substrate disposed under the substrate and attached to the substrate,
   wherein the cushion layer is disposed under the protective substrate and attached to the protective substrate.

8. The display device of claim 7, wherein the display module further comprises:
   a touch sensing unit disposed on the display panel; and
   a window disposed on the touch sensing unit.

9. The display device of claim 1, wherein the supporter comprises:
   a first supporter overlapping the first non-folding area and a portion of the folding area which is adjacent to the first non-folding area; and
   a second supporter overlapping the second non-folding area and a portion of the folding area which is adjacent to the second non-folding area.

10. The display device of claim 9, wherein the first supporter and the second supporter rotate in opposite directions with respect to a folding axis extending in the second direction to inwardly fold the display module such that the first non-folding area and the second non-folding area face each other.

11. The display device of claim 9, wherein the first supporter and the second supporter are respectively attached to a portion of the cushion layer which overlaps the first non-folding area and a portion of the cushion layer which overlaps the second non-folding area, and a portion of the first supporter which overlaps the folding area and a portion of the second supporter which overlaps the folding area are not attached to the portion of the cushion layer which overlaps the folding area.

12. A display device comprising:
   a display module comprising a first non-folding area, a folding area, and a second non-folding area, which are arranged in a first direction, the folding area being disposed between the first non-folding area and the second non-folding area;
   a cushion layer disposed under the display module; and
   a supporter disposed under the cushion layer,
   wherein a groove which overlaps the folding area and mainly extends in a second direction crossing the first direction is defined in the cushion layer,
   the groove comprises:
      a first groove extending in the second direction; and
      a second groove spaced apart from the first groove in the first direction and extending in the second direction, and
   a flat portion of the cushion layer is interposed between the first groove and the second groove.

13. The display device of claim 12, wherein a lower surface of the cushion layer, which is opposite to the upper surface of the cushion layer, comprises a plane defined by the first and second directions.

14. The display device of claim 12, wherein the cushion layer comprises a polyurethane, an acrylic sheet, or a foam sheet having a predetermined elasticity.

15. The display device of claim 12, wherein the display module further comprises:
   a display panel comprising a substrate and a pixel layer disposed on the substrate; and a protective substrate disposed under the substrate and attached to the substrate, and the cushion layer is disposed under the protective substrate and attached to the protective substrate.

16. The display device of claim 12, wherein the supporter comprises:
    a first supporter overlapping the first non-folding area and a portion of the folding area which is adjacent to the first non-folding area; and
    a second supporter overlapping the second non-folding area and a portion of the folding area which is adjacent to the second non-folding area,
    wherein the first supporter and the second supporter rotate in opposite directions with respect to a folding axis extending in the second direction to inwardly fold the display module such that the first non-folding area and the second non-folding area face each other.

17. A display device comprising:
    a display module comprising a first non-folding area, a folding area, and a second non-folding area, which are arranged in a first direction, the folding area being disposed between the first non-folding area and the second non-folding area;
    a cushion layer disposed under the display module; and
    a supporter disposed under the cushion layer,
    wherein a groove mainly extending in a second direction crossing the first direction is defined in the upper surface of the cushion layer which overlaps the display module so that a portion of the display module is disposed in the groove,
    the groove comprises:
        a first groove extending in the second direction; and
        a second groove spaced apart from the first groove in the first direction and extending in the second direction, and
    a flat portion of the cushion layer is interposed between the first groove and the second groove.

* * * * *